United States Patent
Yoon et al.

(10) Patent No.: US 10,054,694 B2
(45) Date of Patent: Aug. 21, 2018

(54) ARRAY SUBSTRATE FOR X-RAY DETECTOR AND X-RAY DETECTOR COMPRISING THE SAME

(71) Applicant: LG Display Co., Ltd., Seoul (KR)

(72) Inventors: JaeHo Yoon, Chilgok-gun (KR); MoonSoo Kang, Daegu (KR); JaeKwang Lee, Daegu (KR); ShiHyung Park, Busan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/391,131

(22) Filed: Dec. 27, 2016

(65) Prior Publication Data

US 2017/0192111 A1    Jul. 6, 2017

(51) Int. Cl.
*G01T 1/24* (2006.01)
*H01L 27/146* (2006.01)

(52) U.S. Cl.
CPC .............. *G01T 1/244* (2013.01); *G01T 1/247* (2013.01); *H01L 27/14658* (2013.01); *H01L 27/14659* (2013.01); *H01L 27/14692* (2013.01); *H01L 27/14636* (2013.01)

(58) Field of Classification Search
CPC .... G01T 1/244; G01T 1/247; H01L 27/14658
See application file for complete search history.

(56) References Cited

U.S. PATENT DOCUMENTS

2013/0334431 A1   12/2013   Ichimura et al.
2014/0103347 A1    4/2014   Ishino

FOREIGN PATENT DOCUMENTS

JP   2009130273 A    6/2009
WO  2015029938 A1    3/2015

OTHER PUBLICATIONS

European Search Report dated May 16, 2017 in corresponding European patent application No. 16 20 7475.

*Primary Examiner* — Hugh H Maupin
(74) *Attorney, Agent, or Firm* — Polsinelli PC

(57) ABSTRACT

The present disclosure relates to an array substrate for an X-ray detector and an X-ray detector including the same. The array substrate is defined as an active area and a pad area, wherein the pad area includes a substrate including a first area and a second area extending from the first area, and a plurality of data lines contacting an upper surface of the substrate and extending toward the second area from the first area, adjacent data lines of the plurality of data lines are spaced apart from each other, the upper surface of the substrate is exposed in a area between the adjacent data lines in the first area of the substrate, and a first insulation film is disposed between the substrate and the data lines in the second area of the substrate, thereby preventing a short-circuit between adjacent data lines due to agglomeration between data lines and an organic layer during cutting.

19 Claims, 7 Drawing Sheets

ARRAY SUBSTRATE FOR X-RAY DETECTOR AND X-RAY DETECTOR COMPRISING THE SAME

CROSS-REFERENCE TO RELATED APPLICATIONS

This application claims the priority of Korean Patent Application No. 10-2015-0191494 filed in the Republic of Korea on Dec. 31, 2015, which is hereby incorporated herein by reference in its entirety.

BACKGROUND

Field of the Disclosure

The present disclosure relates to an array substrate for an X-ray detector and an X-ray detector including the array substrate, and more particularly, to an array substrate for an X-ray detector and an X-ray detector including the array substrate, for preventing a short-circuit caused between adjacent signal lines due to agglomeration of a signal line and an organic layer during a cutting process.

Description of the Background

An X-ray inspection method that has been widely used for medical diagnosis requires an X-ray sensing film and a film printing time to obtain a result.

However, recently, by virtue of development of semiconductor technologies, a digital X-ray detector using a thin film transistor (TFT) has been researched and developed.

The digital X-ray detector advantageously diagnoses a result in real time immediately after an X-ray is taken by using a TFT as a switching device.

In general, two different types are used in the digital X-ray detector; a direct type DXD method and an indirect type DXD method. The direct type DXD method is detecting current by as much as electric charges received from a selenium layer by a pixel electrode of a TFT and performing a signaling processing procedure using a structure including an amorphous Se layer stacked on a TFT array substrate and a transparent electrode formed on the amorphous Sc layer. An indirect type DXD method is converting a visible ray into an electrical signal by a PIN diode and performing a series of signal processing procedures when an X-ray is converted into the visible ray by a scintillator.

An array test has to be performed in order to improve the quality of an X-ray detector. In this regard, the array test is a procedure of examining electrical fault, strain, and other damaged portions in a TFT array state after completion of a TFT array process prior to performing a liquid crystal filling process. Thus, the array test is required because it can reduce additional costs for damages as a mother substrate size becomes larger.

By conducting an array test, it is possible to determine whether defects such as open-circuit or a short-circuit of signal lines occur, and thus defective products can be avoided. In addition, manufacturing yield and productivity can be increased and the overall cost for manufacturing can be saved.

In general, as shown in FIG. 1, a signal line 1 outside a panel is connected to a TFT signal line 2 in order to apply an electrical signal for an array test to the panel After the array test is performed, a panel end is cut by laser, and a product is released. However, there is a problem in that a short-circuit between adjacent signal lines occurs as organic layers are melted and stick together and a metal component in the signal line may agglomerate in an organic insulation layer and, thus, there is a need for a solution to such a problem.

SUMMARY

Accordingly, the present disclosure is directed to an array substrate of an X-ray detector and an X-ray detector including the array substrate that substantially obviate one of more problems due to limitations and disadvantages of the prior art.

It is an object of the present disclosure to provide an array substrate for preventing a short-circuit defects between adjacent data lines due to agglomeration between a data line and an organic layer during a cutting process.

In addition, the present disclosure provides an X-ray detector including the array substrate.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, an array substrate for an X-ray detector, the array substrate being defined as an active area and a pad area, includes a substrate including a first area and a second area extending from the first area, and a plurality of data lines contacting an upper surface of the substrate and extending toward the second area from the first area, wherein adjacent data lines of the plurality of data lines are spaced apart from each other, the upper surface of the substrate is exposed in an area between the adjacent data lines in the first area of the substrate, and a first insulation film is disposed between the substrate and the data lines in the second area of the substrate.

The array substrate may further include a second insulation layer disposed on the data lines in the second area of the substrate. In this case, a bottom surface of the second insulation film contacts an upper surface of the first insulation film.

The first insulation film may include a plurality of insulation layers.

An upper surface of the data lines may be exposed or an insulation layer on the data lines may not be disposed in the first area of the substrate.

In accordance with another aspect of the present disclosure, an X-ray detector includes the array substrate for an X-ray detector.

It is to be understood that both the foregoing general description and the following detailed description are exemplary and explanatory and are intended to provide further explanation of the present disclosure as claimed.

BRIEF DESCRIPTION OF DRAWINGS

The accompanying drawings, which are included to provide a further understanding of the present disclosure and are incorporated in and constitute a part of this application, illustrate aspect(s) of disclosure and together with the description serve to explain the principle of the disclosure.

In the drawings.

DETAILED DESCRIPTION

Figure 1:
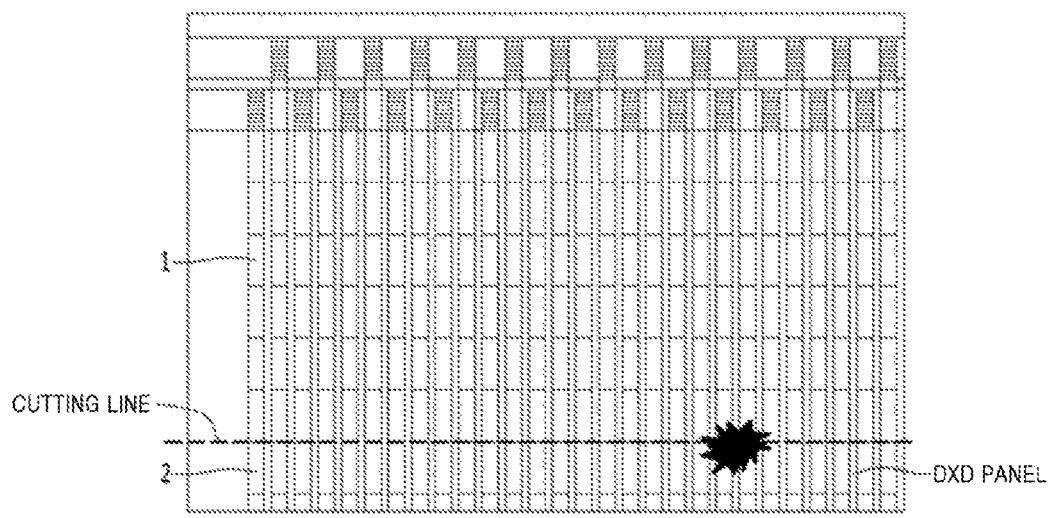
FIG. 1 is a schematic diagram illustrating a short-circuit caused between adjacent signal lines during a cutting process of an array substrate after an array test.

Reference will now be made in detail to the aspects of the present disclosure, examples of which are illustrated in the accompanying drawings. Whenever possible, the same reference numbers will be used throughout the drawings to refer to the same or like parts.

It will be understood that when an element such as a layer, a film, an electrode, a plate, or a substrate is referred to as being "on" or "under" another element, the element may be directly on another element or an intervening element may also be present.

Spatially relative terms, such as "below", "beneath", "lower", "above", "upper", and the like, may be used herein for ease of description to describe one element or feature's relationship to another element(s) or feature(s) as illustrated in the figures. Elements depicted in the drawings are not necessarily to scale with one another, rather individual elements may be enlarged or reduced in order to more easily comprehend the elements in the context of the descriptions.

Figure 2:
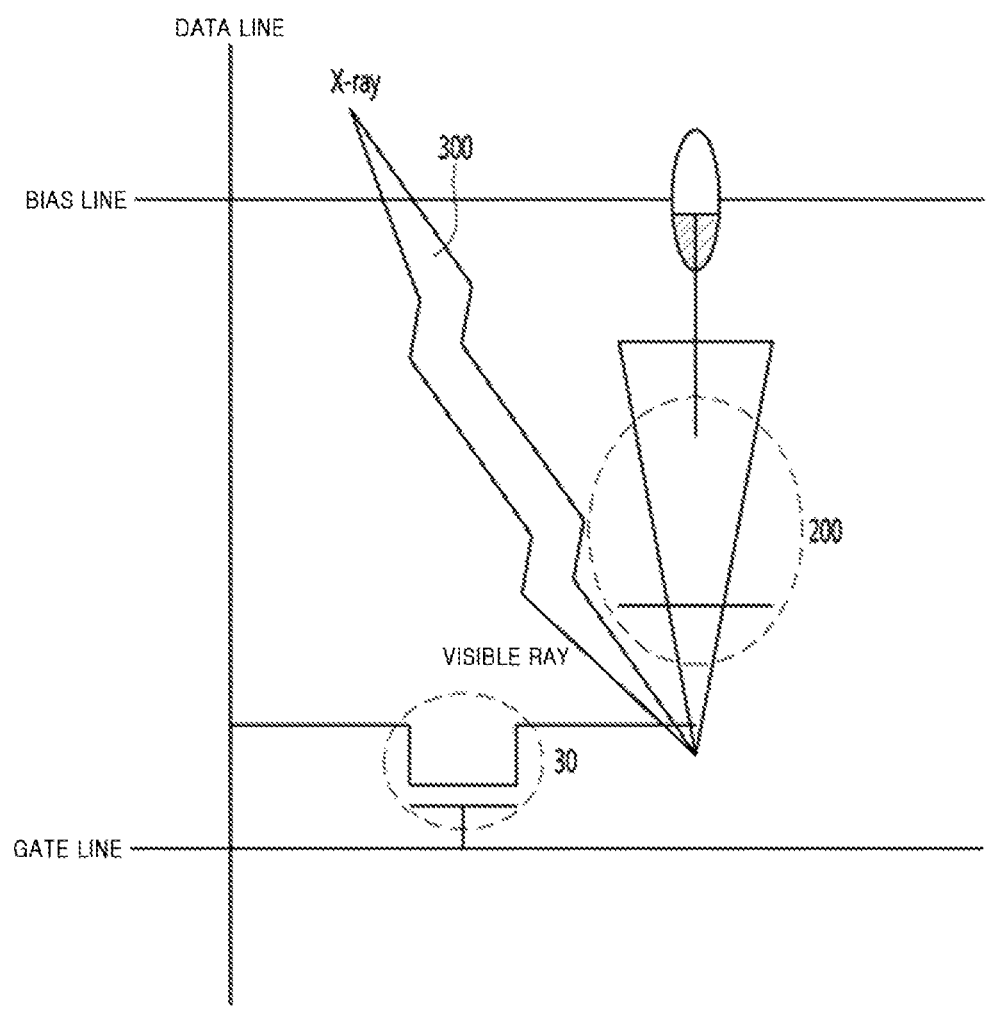
FIG. 2 is a cross-sectional view illustrating an operation of an X-ray detector according to an aspect of the present disclosure.
Figure 3:
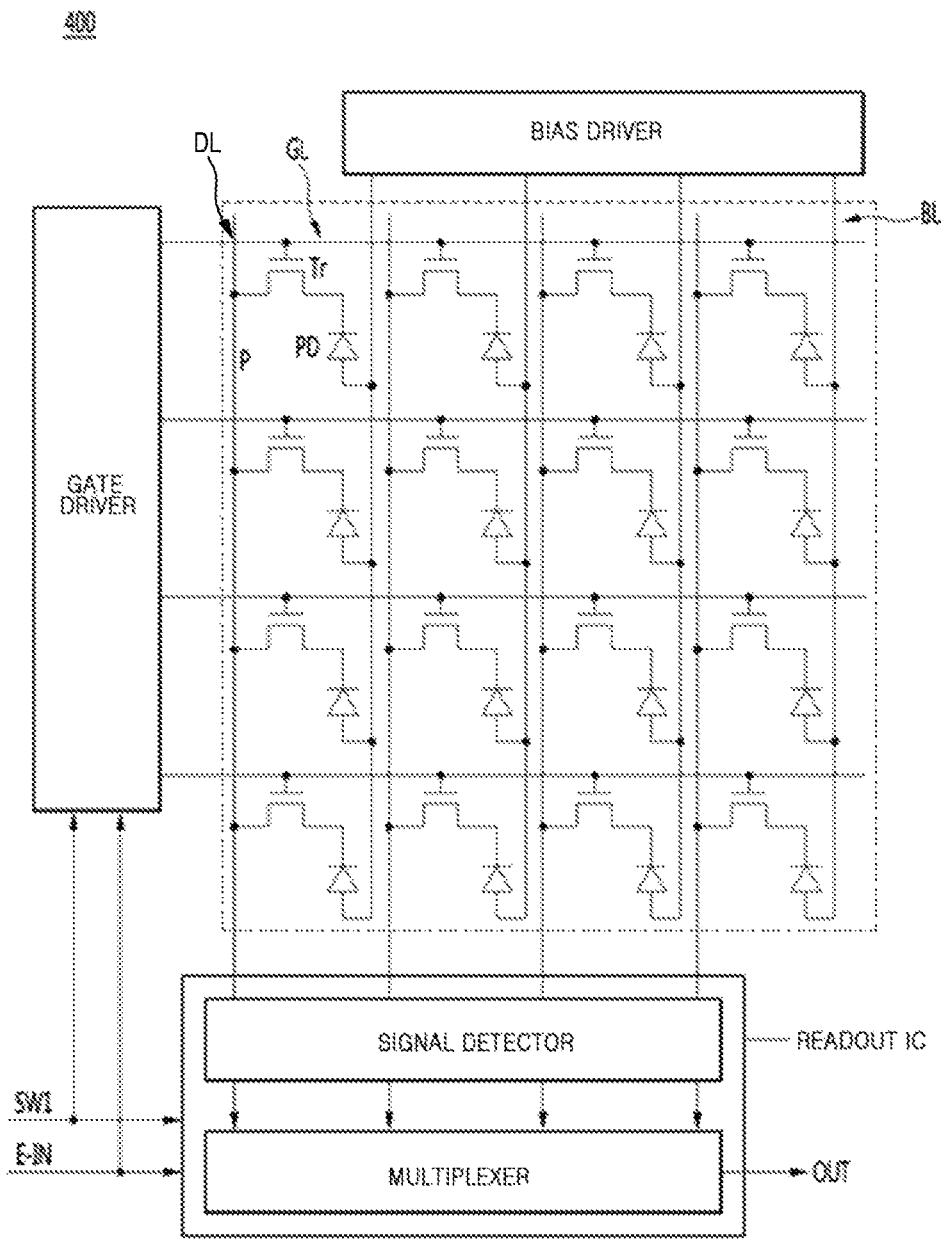
FIG. 3 is a schematic diagram illustrating a structure of an X-ray detector according to an aspect of the present disclosure.

FIG. 2 is a cross-sectional view illustrating an operation of an X-ray detector according to an aspect of the present disclosure. FIG. 3 is a schematic diagram illustrating a structure of an X-ray detector according to an aspect of the present disclosure.

In an indirect-type X-ray detector, an optical detector 200 may be formed on an array substrate in order to detect an X-ray and an optical converter 300 is disposed on the optical detector 200 as shown in FIG. 2.

As illustrated in FIG. 2, the optical converter 300 that receives an X-ray may convert the X-ray into light with a wavelength that is most sensitive to the optical detector 200 via optical conversion and the optical detector 200 may convert the converted light into an electrical signal and transmit the converted electrical signal as an image signal through a transistor. A thin film transistor illustrated in FIGS. 2 and 3 may include a gate electrode, a first insulation layer formed on the gate electrode, an active layer formed on the first insulation layer, and a source electrode and a drain electrode that are connected to one end and the other end of the active layer, respectively, and spaced apart from each other.

As illustrated in FIG. 3, an X-ray detector 400 according to an aspect of the present disclosure may include a pixel area, a bias driver, a gate driver, and a readout integrated circuit (IC).

The pixel area may detect an X-ray emitted from an X-ray generator and may photoelectrically convert the detected signal into an electric detection signal as an output signal.

The pixel area may include a plurality of photosensitive pixels P that are arranged in a matrix form at intersections between a plurality of gate lines GL and a plurality of data lines DL. The plurality of gate lines GL and the plurality of data lines DL may be perpendicular to each other. Although FIG. 3 illustrates an example of 16 photosensitive pixels P that are arranged in 4 rows and 4 columns, the present disclosure is not limited thereto and. The number of photosensitive pixels P may be variously selected.

Each of the photosensitive pixels P may include an optical detector for detecting an X-ray to output a detection signal, e.g., an optical detection voltage and a transistor as a switching device for transmitting an electrical signal output from the optical detector in response to a gate pulse.

The optical detector 200 according to an aspect of the present disclosure may detect an X-ray emitted from the X-ray generator and output a detected signal as the detection signal. The optical detector 200 may be a device for converting emitted light into an electrical signal according to the photoelectric effect and may be, for example, a PIN diode.

The transistor Tr may be a switching device for transmitting the detection signal output from the optical detector 200. The gate electrode of the transistor may be electrically connected to the gate lines GL and the source electrode may be electrically connected to the readout IC through the data lines DL.

The bias driver may apply a driving voltage to a plurality of bias lines BL. The bias driver may selectively apply a reverse bias or forward bias to the optical detector 200.

The gate driver may sequentially apply gate pulses with a gate on voltage level to the plurality of gate lines GL. Transistors of the photosensitive pixels P may be turned on in response to the gate pulse. When the transistor is turned on, the detection signal output from the optical detector 200 may be input to the readout IC through the transistor and the data line DL.

The gate driver may be formed of an IC and may be installed in one side of the pixel area or may be formed on the same substrate as the pixel area through a thin film process.

The readout IC may read out the detection signal output from the transistor that is turned on in response to the gate pulse. The readout IC may read out the detection signal output from the photosensitive pixels P in an offset readout period in which an offset image is read out and an X-ray readout period in which the detection signal is read out after an X-ray exposure.

The readout IC may read the detection signal and transmit the detection signal to a predetermined signal processor and the signal processor may convert the detection signal in a digital signal and display the detection signal as an image. The readout IC may include a signal detector and a multiplexer. In this case, the signal detector may further include a plurality of amplification units corresponding to each of the data lines DL. Each of the amplification units may include an amplifier, a capacitor, and a reset device.

Figure 4:
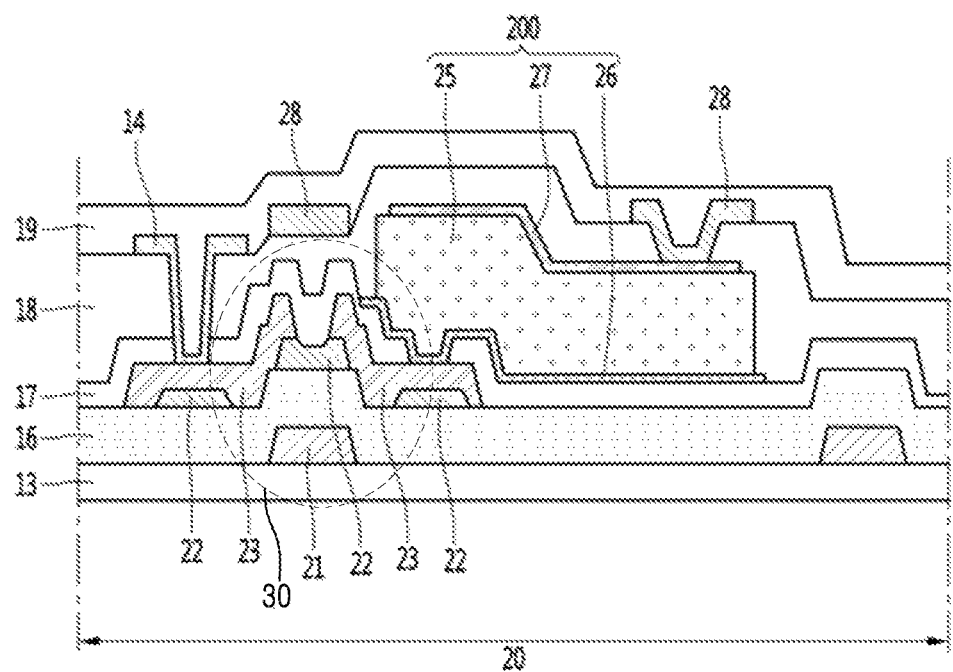
FIG. 4 is a cross-sectional view of an active area of an array substrate according to an aspect of the present disclosure.
Figure 5:
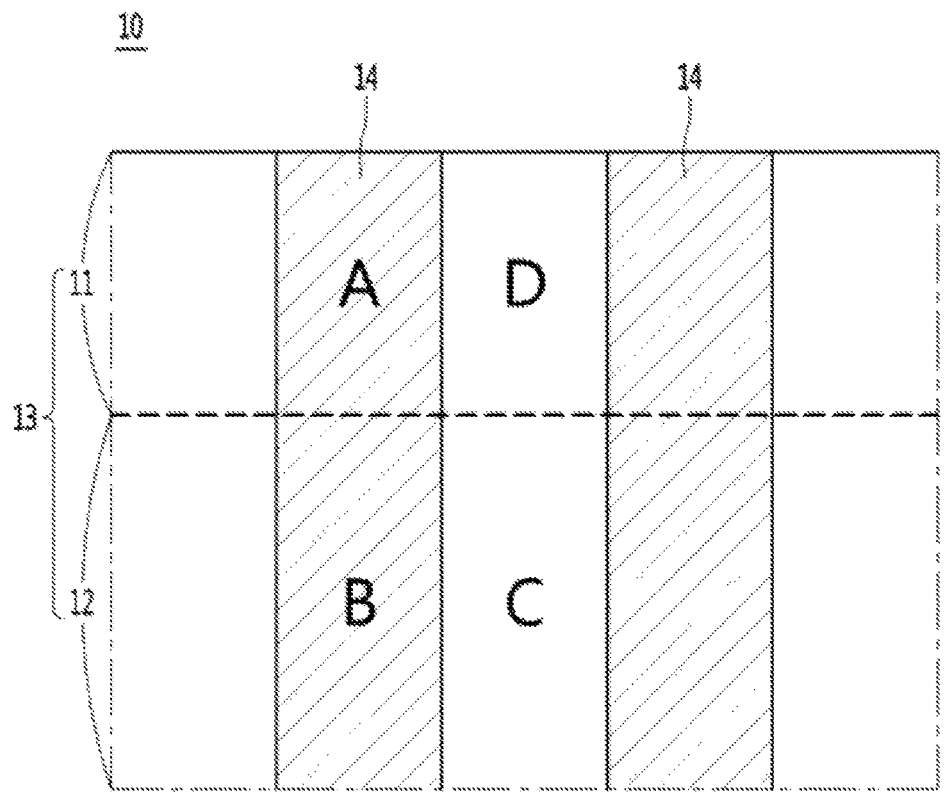
FIG. 5 is a schematic plan view of a pad area of an array substrate according to an aspect of the present disclosure.

An array substrate for an X-ray detector according to an aspect of the present disclosure may be defined as an active area 20 and a pad area 10 as shown in FIGS. 4 and 5.

FIG. 4 is a cross-sectional view of an active area 20 of an array substrate 100 according to an aspect of the present disclosure. Hereinafter, the present disclosure will be described with reference to FIG. 4.

The active area 20 may include a plurality of data lines 14, a plurality of gate lines, a plurality of pixel areas defined by the plurality of data lines 14 and the plurality of gate lines intersecting each other, a plurality of optical detectors 200 each disposed in the respective pixel areas and converting a photoelectric signal into an electrical signal, and a plurality of TFTs 30 that performs switching operation to drive the plurality of optical detectors 200.

The TFT 30 may include a gate electrode 21 connected to a gate line, an active layer 22 positioned on the gate electrode 21, a source electrode 23 for connection between one end of the active layer 22 and the data lines 14, and a drain electrode 23 connected to the other end of the active layer 22. The drain electrode 23 may be connected to the optical detector 200.

The array substrate 100 may further include the data line 14 connected to the source electrode 23 and a bias line 28 for applying a bias voltage to control electrons and holes of the optical detector 200. The bias line 28 may be formed of an opaque metallic material.

The gate electrode 21 may be formed of, but is not limited to, a material such as aluminum (Al), molybdenum (Mo), and an alloy thereof.

The active layer 22 may include a first amorphous silicon layer that is not doped with impurities and a second amorphous silicon layer that is doped with n-type impurities.

The source/drain electrode 23 may be formed of, but is not limited to, a material such as aluminum (Al), molybdenum (Mo), and an alloy thereof.

A first insulation film on a substrate 13 includes a stack of first, second, and third insulation layers 16, 17, and 18. The second insulation layer 17 may have a first contact hole formed therein to expose a portion of the drain electrode 23 and, through the first contact hole, the source electrode 23 and the data lines 14 may be connected to each other and the drain electrode 23 and a lower electrode 26 of the optical detector 200 may be connected to each other.

The third insulation layer 18 may be formed on the second insulation layer 17 and an upper electrode 27 of the optical detector 200 and may have a second contact hole for exposing a portion of the upper electrode 27. The upper electrode 27 and the bias line 28 may be connected to each other through the second contact hole.

A second insulation film 19 may be formed on the third insulation layer 18 and the bias line 28 and may not include a hole in the active area 20.

Figure 6:
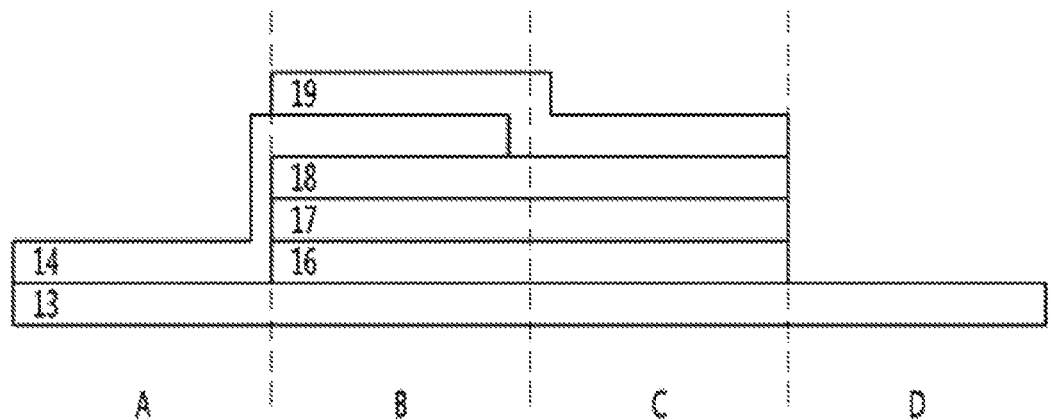
FIG. 6 is a vertical cross-sectional view of the pad area of the array substrate illustrated in FIG. 5.

FIG. 5 is a schematic plan view of a pad area of the array substrate 100 according to an aspect of the present disclosure. FIG. 6 is a vertical cross-sectional view of the pad area of the array substrate 100 illustrated in FIG. 5. Hereinafter, an aspect of the present disclosure will be described with reference to FIGS. 5 and 6.

As shown in FIG. 5, the pad area 10 may include a substrate 13 including a first area 11 and a second area 12.

According to the aspect of the present disclosure, the substrate 13 may have a plate shape and may be formed of, but is not limited to, a transparent material such as glass, quartz, and a synthetic resin.

The first area 11 may be one area of the substrate 13 and the outermost portion of the pad area 10 in the array substrate 100. Also, after an array test is completed, the first area 11 becomes an area adjoining a cutting area of the data line 14 that was connected to the test line.

The second area 12 may be another area of the substrate 13 extending from the first area 11 of the substrate 13. The second area 12 is spaced apart from the cutting line of the array substrate 100 at a predetermined interval, and thus the second area 12 is closer to the active area 20 of the array substrate 100 than the first area 11.

The plurality of data lines 14 according to the present disclosure may directly come in contact with an upper surface of the substrate 13 and extend toward the second area 12 from the first area 11. Adjacent data lines 14 among the plurality of data lines 14 may be spaced apart from each other.

The data lines 14 may be formed of, but is not limited to, a material such as molybdenum (Mo), molybdenum-tungsten alloy (MoW), chromium (Cr), tantalum (Ta), titanium (Ti), and so on.

As described in the background section, in order to perform an array test on an array substrate, test lines outside a panel was connected to signal lines of the array substrate and an end portion of the array substrate (i.e., an edge of a pad area) was cut by laser along the outer periphery of the panel after the completion of the array test. In this case, in the pad area of the conventional array substrate for an X-ray detector, data lines are disposed between organic layers and thus, there is a problem in that a short-circuit is caused between different signal lines as the organic layers are melted and agglomerated together during a cutting process, thereby increasing a failure rate.

In view of the above, according to the aspect of the present disclosure, the pad area 10 of the array substrate 100 may be divided into the first and second areas 11 and 12. Accordingly, in the first area 11, the data lines 14 may be formed directly on the substrate 13 and the substrate 13 may be exposed between adjacent data lines 14 among the data lines 14. Therefore, even when an edge of the array substrate 100 is cut by laser after an array test is performed, only the substrate 13 or metal formed on the substrate 13 are present in the first area 11. As a result, it is possible to prevent the problem that a short-circuit is caused between adjacent signal lines when organic layers stick together.

More specifically, a portion (D) of an upper surface of the substrate 13 may be exposed between the adjacent data lines 14 in the first area 11 of the substrate 13. That is, no other components are disposed and only a portion (D) of the substrate 13 is exposed between adjacent data lines 14 in the first area 11 of the substrate 13. In addition, the second area 12 of the substrate 13 may include a first insulation film between the substrate 13 and the data lines 14. That is, in the second area 12 of the substrate 13, the first insulation film may be disposed on the substrate 13 and the data lines 14 may be disposed on the first insulation film. Although some of the data lines 14 are disposed between insulation layers in the second area 12, the second area 12 is not cut by laser and, thus, the problem of a short-circuit between the data lines 14 does not occur.

According to an aspect of the present disclosure, the first insulation film may include a plurality of insulation layers. Specifically, the first insulation film may be a stack of a first insulation layer 16, the second insulation layer 17, and the third insulation layer 18.

FIGS. 7A to 7D are schematic diagrams sequentially illustrating a method of forming the pad area 10 of the array substrate 100 according to an aspect of the present disclosure.

Figure 7A:
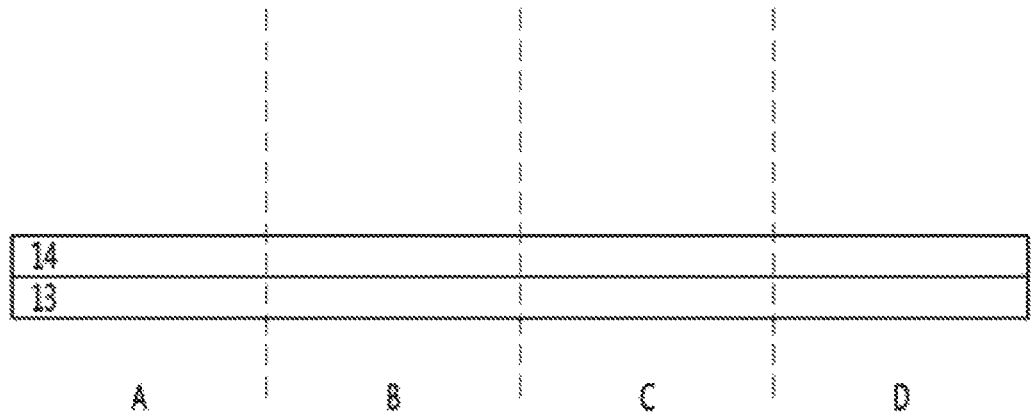
FIGS. 7A to 7E are schematic diagrams sequentially illustrating a method of forming a pad area of an array substrate according to an aspect of the present disclosure.
Figure 7B:
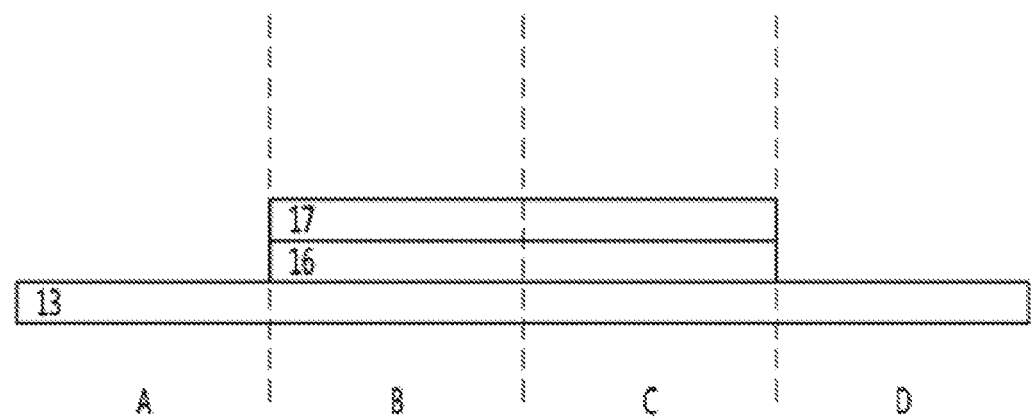
Figure 7C:
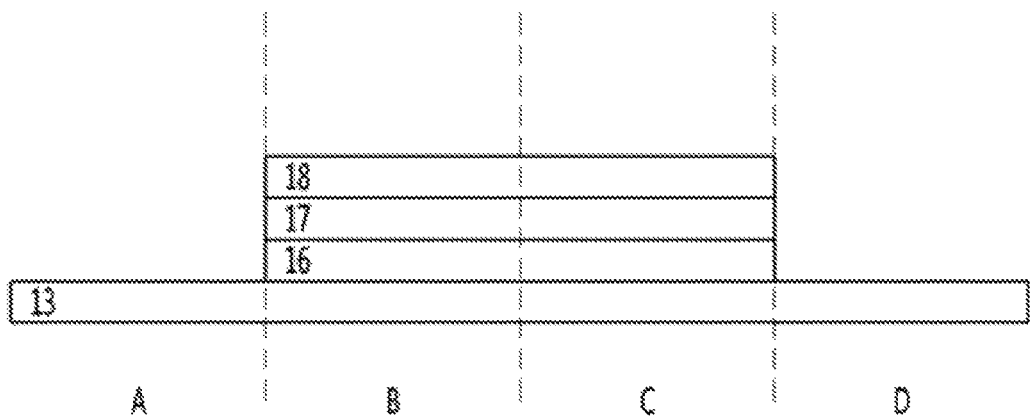
Figure 7D:
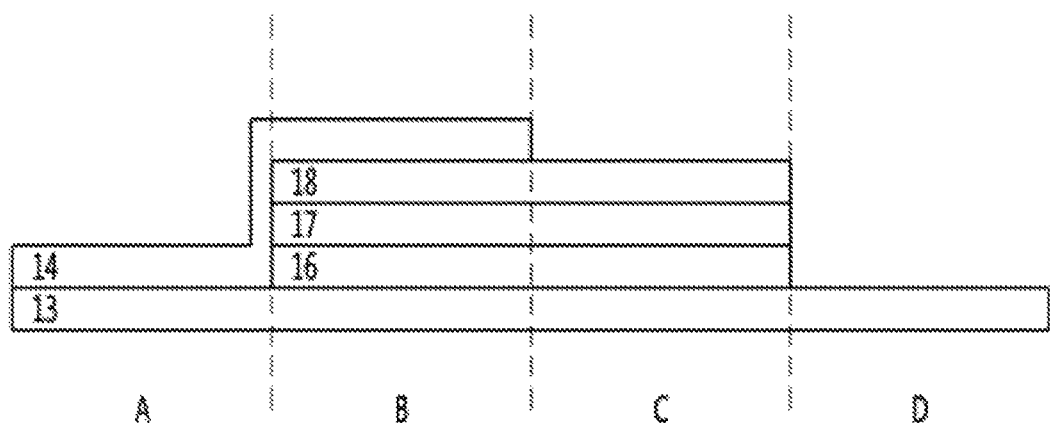
Figure 7E:
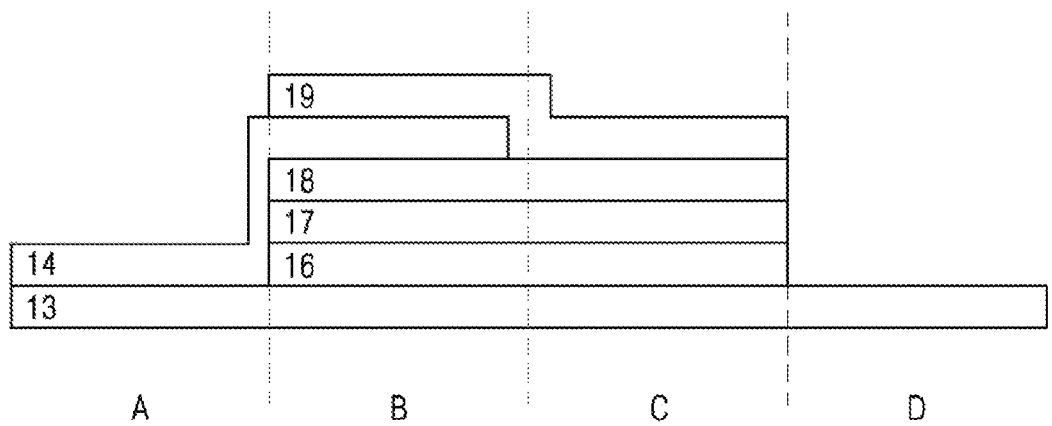

First, in the pad area 10, a material for forming a first insulation layer may be applied onto the substrate 13 (FIG. 7A). Then, a material for forming a second insulation layer may be applied, photolithography may be performed using a mask, and then etching and strip processes may be performed thereon. As a result, the first and second insulation layers 16 and 17 are formed in the second area 12 of the substrate 13 but not in the first area 11 (FIG. 7B). Subsequently, a material for forming a third insulation layer may be applied, photolithography may be performed using a mask, and then etching and strip processes may be performed thereon, such that the third insulation layer 18 is formed in the second area 11 of the substrate 13 but not in the first area 11 (FIG. 7C). Then, a material for forming a data line may be applied to form the data line 14 in the first area 11 or the second area 12 of the substrate 13, wherever necessary, via the same process (FIG. 7D). Then, the second insulation film 19 may be formed only in the second area 12 of the substrate 13 via the same process after the material for the second insulation film is applied (FIG. 7E).

In this case, the first insulation film (the first to third insulation layers 16, 17, and 18) and the second insulation film 19 may include, but is not limited to, silicon oxide or silicon nitride. The first and second insulation films may be formed of any other materials as long as they fall within the scope and spirit of the present disclosure.

According to an aspect of the present disclosure, an upper surface of the data line 14 disposed in the first area 11 of the substrate 13 may be exposed, and no insulation film may be disposed on the data line 14 in the first area 11. In this case, only the data line 14 is disposed and no organic layer is disposed in the first area 11 of the substrate 13 including a cutting portion of the array substrate 100 after the array test, and thus a short-circuit caused between adjacent signal lines can be avoided. In the present disclosure, the first insulation film may be formed of, but is not limited to, silicon oxide or silicon nitride.

According to an aspect of the present disclosure, the second area 12 of the substrate 13 may further include the second insulation film 19 on the data line 14. Although the second insulation film 19 is disposed on the data line 14, the second insulation film 19 is formed on the data line 14 disposed in the second area 12 of the substrate 13, and thus no short-circuit is caused between the data lines 14.

Similar to the first insulation film, the second insulation film 19 may be formed of, but is not limited to, silicon oxide or silicon nitride.

According to an aspect of the present disclosure where the second insulation film 19 is further included, a bottom surface of the second insulation film 19 may be in contact with an upper film of the first insulation film between the adjacent data lines 14 disposed in the second area 12 of the substrate 13. That is, a stack of the first insulation film and the second insulation film 19 may be disposed on the substrate 13 between the adjacent data lines 14 in the second area 12 of the substrate 13.

According to an aspect of the present disclosure, a vertical height of an upper surface of the data line 14 disposed in the first area 11 of the substrate 13 may be different from a vertical height of an upper surface of the data line 14 disposed in the second area 12 of the substrate 13. Specifically, the data line 14 comes in contact with an upper portion of the substrate 13 in the first area 11 of the substrate 13 while the data line 14 is disposed on the first insulation film in the second area 12 of the substrate 13. Accordingly, there is a difference between the vertical heights of the upper surfaces of the data lines 14 disposed in the first and second areas 11 and 12, which equals to the thickness of the first insulation film disposed in the second area 12.

The X-ray detector according to the present disclosure may include the aforementioned array substrate 100 for an X-ray detector according to the present disclosure.

The array substrate 100 may correspond to the array substrate 100 according to the present disclosure; and, therefore, the redundant description will be omitted.

The optical detector 200 included in the X-ray detector according to the present disclosure may have a function of converting an optical signal into an electric detection signal, which has passed through an optical converter to be described later and has been converted into a visible ray wavelength range. The amount of current flowing in the optical detector may vary depending on the amount of transmitted light. Specifically, the optical detector 200 may be a PIN diode.

The optical detector 200 may include the lower electrode 26 of the array substrate 100, a photoconductor layer 25 on the lower electrode 26, and the upper electrode 27 on the photoconductor layer 25. The photoconductor layer 25 may include an n-type semiconductor layer including an n-type dopant, an intrinsic semiconductor layer that does not include any dopant, and a p-type semiconductor layer including a p-type dopant.

The lower electrode 26 of the optical detector 200 may be electrically connected to the drain electrode 23 of a transistor and the upper electrode 27 may be electrically connected to a bias line to which a bias voltage is applied.

The optical converter 300 included in the X-ray detector according to the present disclosure may be disposed above the optical detector 200, specifically, the second insulation film of the array substrate 100.

The optical converter 300 may convert an X-ray transmitted from an X-ray generator through a target object into green light having a wavelength of about 550 nm of a visible ray range and transmit the green light to the pixel area. The optical converter 300 may be formed of, for example, a cesium iodide compound.

The X-ray detector according to the present disclosure includes an array substrate for an X-ray detector according to the present disclosure and, thus, even if a signal line of the array substrate is cut from an array test line after an array test is performed, a short-circuit between lines can be prevented so as to improve yield and prevent defective products.

The array substrate according to the present disclosure may prevent a short-circuit between adjacent data lines due to agglomeration between data lines and an organic layer during a cutting process.

In addition, in the X-ray detector according to the present disclosure, an array test can be performed without a short-circuit between adjacent data lines of an array substrate, thereby improving yield and reducing costs for processing RMA.

It will be apparent to those skilled in the art that various modifications and variations can be made in the array substrate for an X-ray detector and the X-ray detector including the array substrate of the present disclosure without departing from the spirit or scope of the disclosure. Thus, it is intended that present disclosure cover the modifications and variations of this disclosure provided they come within the scope of the appended claims and their equivalents.

What is claimed is:

1. An array substrate for an X-ray detector having a pad area and active area, the pad area comprising:
   a substrate having a first area and a second area extending from the first area, wherein the first area is an outermost portion of the pad area and includes a cutting portion of the substrate;
   a plurality of data lines in contact with an upper surface of the substrate at the first area and extending toward the second area from the first area,
   wherein adjacent data lines of the plurality of data lines are spaced apart from each other, a portion of the upper surface of the substrate is exposed between the adjacent data lines in the first area; and
   a first insulation film disposed between the substrate and the data lines in the second area.

2. The array substrate according to claim 1, further comprising:
a second insulation film disposed on the data lines in the second area of the substrate.

3. The array substrate according to claim 2, wherein a bottom surface of the second insulation film is in contact with an upper surface of the first insulation film between the adjacent data lines disposed in the second area of the substrate.

4. The array substrate according to claim 1, wherein the first insulation film comprises a plurality of insulation layers.

5. The array substrate according to claim 1, wherein an upper surface of the data lines is exposed in the first area of the substrate.

6. The array substrate according to claim 1, wherein the data lines in the first area are not covered with an insulation layer.

7. The array substrate according to claim 1, wherein the upper surface of the substrate is covered with the data lines in the first area.

8. The array substrate according to claim 1, wherein the upper surface of the substrate is exposed in the first area.

9. The array substrate according to claim 1, wherein the data lines in the first area has a vertical height from the substrate to an upper surface of the data lines different from that of the data lines in the second area.

10. A pad area of an array substrate for an X-ray detector, comprising,
first and second areas adjacent to each other and defined in a substrate, wherein the first area is where a substrate cutting process is performed after completion of an array test on the array substrate;
a plurality of data lines on the substrate and extended from the first area to the second area, the plurality of data lines having adjacent data lines spaced apart from each other, a portion of an upper surface of the substrate exposed between the adjacent data lines at the first area; and
a first insulation film between the substrate and the data lines at the second area,
wherein the plurality of data lines are in contact with an upper surface of the substrate at the first area.

11. The pad area according to claim 10, further comprising:
a second insulation film disposed on the data lines at the second area of the substrate.

12. The pad area according to claim 10, wherein the first insulation film comprises a stack of insulation layers.

13. The pad area according to claim 10, wherein an upper surface of the data lines is exposed at the first area.

14. The pad area according to claim 10, wherein the upper surface of the substrate is covered with the data lines at the first area.

15. The pad area according to claim 10, wherein the upper surface of the substrate is exposed at the first area.

16. The pad area according to claim 10, wherein the upper surface of the substrate is not covered with an insulation layer.

17. The pad area according to claim 10, wherein the data lines at the first area has a vertical height from the substrate to an upper surface of the data lines different from that of the data lines at the second area.

18. The pad area according to claim 10, wherein the second insulation film contacts the first insulation film between the adjacent data lines disposed in the second area.

19. An X-ray detector, comprising:
an array substrate comprising,
a pad area with first and second areas adjacent to each other and defined in a substrate, wherein the first area is where a substrate cutting process is performed after completion of an array test on the array substrate,
a plurality of data lines on the substrate and extended from the first area to the second area, the plurality of data lines having adjacent data lines spaced apart from each other, a portion of an upper surface of the substrate exposed between the adjacent data lines at the first area, and a first insulation film between the substrate and the data lines at the second area; and
an active area comprising a plurality of optical detectors each disposed in respective pixel areas and converting a photoelectric signal into an electrical signal, and a plurality of thin film transistors performing switching operation to drive the plurality of optical detectors,
wherein the plurality of data lines are in contact with an upper surface of the substrate at the first area.

* * * * *